(12) United States Patent
Hsu

(10) Patent No.: US 7,038,375 B2
(45) Date of Patent: May 2, 2006

(54) POLYMER BUFFER LAYERS AND THEIR USE IN LIGHT-EMITTING DIODES

(75) Inventor: Che-Hsiung Hsu, Wilmington, DE (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 0 days.

(21) Appl. No.: 11/184,936

(22) Filed: Jul. 19, 2005

(65) Prior Publication Data

US 2005/0263781 A1 Dec. 1, 2005

Related U.S. Application Data

(62) Division of application No. 10/372,351, filed on Feb. 24, 2003, now Pat. No. 6,955,773.

(60) Provisional application No. 60/361,029, filed on Feb. 28, 2002.

(51) Int. Cl.
 *H01J 1/62* (2006.01)
(52) U.S. Cl. ........................ 313/506; 313/498
(58) Field of Classification Search ............... 313/498, 313/500, 506–509
 See application file for complete search history.

(56) References Cited

U.S. PATENT DOCUMENTS

| | | |
|---|---|---|
| 4,552,927 A | 11/1985 | Warren |
| 4,959,430 A | 9/1990 | Jonas et al. |
| 5,232,631 A | 8/1993 | Cao et al. |
| 5,247,190 A | 9/1993 | Friend et al. |
| 5,286,413 A | 2/1994 | Hannecart et al. |
| 5,300,575 A | 4/1994 | Jonas et al. |
| 5,317,169 A | 5/1994 | Nakano et al. |
| 5,378,402 A | 1/1995 | Cross et al. |
| 5,705,888 A | 1/1998 | Staring et al. |
| 5,723,873 A | 3/1998 | Yang |
| 5,766,515 A | 6/1998 | Jonas et al. |
| 5,798,170 A | 8/1998 | Zhang et al. |
| 5,840,214 A | 11/1998 | Kinlen |
| 5,965,281 A | 10/1999 | Cao |
| 5,986,400 A | 11/1999 | Staring et al. |
| 5,994,496 A | 11/1999 | Van Haare et al. |
| 2002/0022191 A1 | 2/2002 | Lamotte et al. |

FOREIGN PATENT DOCUMENTS

| | | |
|---|---|---|
| EP | 0 440 957 B1 | 3/1996 |
| GB | 2 124 635 A | 2/1984 |

OTHER PUBLICATIONS

A. J. Sharpe, Jr. et al., Improved Cationic Conductive Polymer. Calgon Corp., Pittsburgh, PA. Coating Conference [Proceedings], pp. 83-87, 1981, ISSN 0364-2771.

*Primary Examiner*—Vip Patel

(57) ABSTRACT

The present invention is directed to improved transparent electrically conductive buffer layers for light-emitting diodes. The use of an aqueous dispersion containing an electrically conducting polymer and a non-ionic surfactant or an ionic fluorosurfactant to form the buffer layer has been shown to provide a buffer layer that results in improved light-emitting diode performance.

30 Claims, No Drawings

POLYMER BUFFER LAYERS AND THEIR USE IN LIGHT-EMITTING DIODES

This application is a divisional of U.S. applicaton, Ser. No. 10,372,351, filed Feb. 24, 2003, now U.S. Pat. No. 6,955,773 issued Oct. 18, 2005, which is a Non- Provisional of U.S. application No. 60/361,029, filed Feb. 28, 2002.

FIELD OF THE INVENTION

This invention relates to a transparent electrically conductive buffer layer comprised of a conductive polymer and a surfactant and to light-emitting devices containing such a layer.

BACKGROUND OF THE INVENTION

Electrically conductive polymers have been found to be useful in organic electronic devices that emit light, such as light-emitting diodes (LEDs). In all such devices an organic active emission layer is sandwiched between two electrodes which serve as the anode and the cathode. At least one of the electrodes is comprised of a material that transmits light. The active emission layer emits light through the light-transmitting electrode, typically an indium tin oxide anode, upon application of a voltage to the device. It is well known to use a layer of conductive polymer, such as a polyaniline or a poly(dioxythiophene), between the inorganic anode and the light-emitting layer. The conductive polymer layer is variously referred to as part of the anode, a hole-injection layer or a buffer layer. Such systems have been described in, for example, Jonas et al., U.S. Pat. No. 5,766,515, Yang, U.S. Pat. No. 5,723,873 and Zhang et al., U.S. Pat. No. 5,798,170.

Useful synthetic procedures for the preparation of a polyaniline (PAni) or a poly(dioxythiophene) such as poly (3,4-ethylenedioxythiophene) (PEDOT) are well known and these materials are readily available commercially.

Kinlen et al., U.S. Pat. No. 5,840,214, disclose a process for increasing the conductivity of a polyaniline comprising contacting the polyaniline with an ionic surfactant. Kinlen et al. demonstrated the process by forming an polyaniline film and subsequently contacting the polyaniline film with an ionic surfactant. They also disclose that the treatment of the polyaniline salt in xylenes prior to processing into the final form is possible where both the polyaniline salt and the anionic surfactant are soluble in an amount of at least about 1% w/w for each of the polyaniline salt and the ionic surfactant.

It is desirable to find a polymer with electrical properties that provides better performance as a buffer layer in a light-emitting device.

SUMMARY OF THE INVENTION

The present invention provides a light-emitting device on a substrate. The light-emitting device comprises an anode, a cathode, an active emission layer positioned between the anode and the cathode, and a buffer layer positioned between the anode and the active emission layer, wherein the buffer layer is comprised of an electrically conducting polymer and a surfactant. The amount of the surfactant is from about 0.5 wt % to about 15 wt % of the total weight of the surfactant and the electrically conducting polymer and the surfactant is selected from a fluorosurfactant, a polyoxyethylene alkylphenol ether, or a mixture thereof.

This invention also provides a light-emitting device on a substrate, the light-emitting device comprising an anode, a cathode, an active emission layer positioned between the anode and the cathode, and a buffer layer positioned between the anode and the active emission layer, wherein the buffer layer is formed using an aqueous dispersion of an electrically conducting polymer to which has been added a surfactant. The dispersion is characterized by a surface tension of between 25 and 35 mN/M. The concentration of the electrically conducting polymer is from 0.1 to 5.0% w/w of the total dispersion. The concentration of the surfactant is less than about 0.4% w/w of the total dispersion and the surfactant is selected from a fluorosurfactant, a polyoxyethylene alkylphenol ether, or a mixture thereof.

The use of the buffer layer of this invention also enables the use of a light-transmitting bilayer anode comprised of a metal layer and a thin layer of an inorganic dielectric with the dielectric layer adjacent to the buffer layer.

This invention also provides a composition useful for forming a buffer layer positioned between an anode and an active emission layer of a light-emitting device, the composition comprising an aqueous dispersion of an electrically conducting polymer to which has been added a surfactant. The dispersion is characterized by a surface tension of between 25 and 35 mN/M. The concentration of the electrically conducting polymer is from 0.1 to 5.0% w/w of the total dispersion. The concentration of the surfactant is less than about 0.4% w/w of the total dispersion and the surfactant is selected from a fluorosurfactant, a polyoxyethylene alkylphenol ether, or a mixture thereof.

As used herein, the term "total dispersion" indicates the total of the solids and the liquid carrier of the dispersion. In addition, the IUPAC numbering system is used throughout, where the groups from the Periodic Table are numbered from left to right as 1 through 18 (CRC Handbook of Chemistry and Physics, $81^{st}$ Edition, 2000). The phrase "adjacent to" does not necessarily mean that one layer is immediately next to another layer. An intermediate layer or layers may be provided between layers said to be adjacent to each other.

DETAILED DESCRIPTION OF THE PREFERRED EMBODIMENT

This invention relates to the formation of a layer of conductive polymer that provides better performance as a buffer layer in a light-emitting device. It has been found that a buffer layer formed using a composition comprised of an electrically conductive polymer and specific surfactants, and therefore comprised of these same constituents, provides a buffer layer with the desired improved performance. Surfactants could be considered impurities that adversely impact device performance. Surprisingly, these specific surfactants i.e., fluorosurfactants or polyoxyethylene alkylphenol ethers, not only facilitate the coating of the aqueous dispersion to form the buffer layer, but also improve device performance and facilitate the use of flexible substrates. It is critical to evaluate a buffer layer as part of a light-emitting device in order to demonstrate improved performance.

The present invention also relates to an light-emitting device comprising an organic active emission layer sandwiched between two electrical contact layers, wherein a buffer layer comprising an electrically conducting polymer and a surfactant is positioned between the light-emitting layer and the electrical contact layer which functions as an anode. The device has an inorganic anode layer and a cathode layer. Adjacent to the anode is the buffer layer.

Adjacent to the cathode is an optional layer comprising an electron transport material. Between the buffer layer and the cathode (or optional electron transport layer) is the active emission layer.

The device generally also includes a support, which can be adjacent to the anode or the cathode. Most frequently, the support is adjacent to the anode. The support can be flexible or rigid, organic or inorganic. Generally, glass or flexible organic films, such as poly(ethylene terephthalate), are used as a support.

The anode is an electrode that is particularly efficient for injecting or collecting positive charge carriers. The anode can be a metal, a mixed metal, an alloy, a metal oxide or a mixed-metal oxide. Suitable metals include the Group 11 metals, the metals in Groups 4, 5, and 6, and the Group 8–10 transition metals. If the anode is to be light-transmitting, mixed-metal oxides of Groups 12, 13 and 14 metals, such as indium tin oxide (ITO), are generally used.

The use of the buffer layer of this invention also enables the use of a light-transmitting bilayer anode comprised of a metal layer and a thin layer of an inorganic dielectric with the dielectric layer adjacent to the buffer layer. An additional thin dielectric layer can be deposited on the substrate before the metal layer is deposited. A multilayer anode comprised of two or more such bilayers of metal and dielectric, i.e., metal-dielectric-metal-dielectric, etc., can also be used. The metal in the bilayer is comprised of silver, gold, nickel, chromium, cobalt, alloys thereof and alloys of these metals with iron. The dielectric in the bilayer is comprised of an oxide of a Group 13 or 14 element, such as silicon, indium, titanium, tin, germanium and aluminum, or a fluoride such as magnesium fluoride. In a preferred embodiment, the buffer layer is provided directly on a dielectric layer of a multilayer anode containing at least one bilayer.

The anode is usually applied by a physical vapor deposition process. The term "physical vapor deposition" refers to various deposition approaches carried out in vacuo. Thus, for example, physical vapor deposition includes all forms of sputtering, including ion beam sputtering, as well as all forms of vapor deposition such as electron beam evaporation. A specific form of physical vapor deposition that is useful is radio frequency magnetron sputtering.

The buffer layer can be applied using any conventional means, including spin-coating, casting, and printing, such as gravure printing. The buffer layer can also be applied by ink jet printing or thermal patterning. The composition of this invention that is useful for forming a buffer layer positioned between the anode and the active emission layer of a light-emitting device comprises an aqueous dispersion of an electrically conducting polymer to which has been added a surfactant. The electrically conducting polymer is preferably a polyaniline (PAni) or a poly(dioxythiopene). A preferred poly(dioxythiopene) is poly(3,4-ethylenedioxythiophene) (PEDOT). The oxidative polymerization processes for producing a polyaniline or a poly(dioxythiopene) can be carried out in the presence of a poly(acrylamidoalkylsulfonic acid) (PAAMPSA) or a poly(styrenesulfonic acid) (PSSA) and result in complexes such as PEDOT/PAAMPSA, PEDOT/PSSA, Pani/PAAMPSA and PAni/PSSA. As used herein, the terms polyaniline, poly(dioxythiopene) and poly(3,4-ethylenedioxythiophene) each means the polymer itself as well as the complexes comprised of the polymer.

The surfactant is a fluorosurfactant or a polyoxyethylene alkylphenol ether. The surfactant can be a non-ionic surfactant, i.e., a non-ionic fluorosurfactant or a polyoxyethylene alkylphenol ether or an ionic fluorosurfactant. Non-ionic surfactants are preferred. A preferred polyoxyethylene alkylphenol ether is polyoxyethylene (10) isooctylphenyl ether. The non-ionic fluorosurfactant is preferably a fluoroaliphatic polymeric ester or a fluorosurfactant containing a perfluoroalkyl group with the formula $F(CF_2CF_2)_{3-8}$. Especially preferred is a perfluoroalkylpolyoxyethylene. An ionic fluorosurfactant preferably contains a perfluoroalkyl group with the formula $F(CF_2CF_2)_{3-8}$. Especially preferred is a lithium carbonate of perfluoroalkylethylenesulfurethylene anionic surfactant. Amphoteric surfactants such as perfluoroalkyl N-type betaines, and cationic surfactants such as perfluoroalkylammonium halides, can also be used.

The concentration of the electrically conducting polymer is from 0.1 to 5.0% w/w of the total dispersion. The concentration of the surfactant is less than about 0.4% w/w of the total dispersion. Preferably, the concentration of the electrically conducting polymer is from 0.5 to 3.0% w/w of the total dispersion and the concentration of the surfactant is less than about 0.3% w/w of the total dispersion. The amount of a particular surfactant used depends on the particular electrically conducting polymer used and the concentration of that electrically conducting polymer in the dispersion. The amount of the surfactant is chosen to provide a surface tension of the dispersion of between 25 and 35 mN/M.

This invention provides a light-emitting device in which the buffer layer is made using the composition that comprises an aqueous dispersion of an electrically conducting polymer to which has been added a surfactant as described in the previous paragraph.

The buffer layer of the light-emitting device of the invention is comprised of an electrically conducting polymer and a surfactant wherein the amount of the surfactant is from about 0.5 wt % to about 15 wt % of the total weight of the surfactant and the electrically conducting polymer. The surfactant is a fluorosurfactant or a polyoxyethylene alkylphenol ether as described in connection with the composition of the invention. Preferably the amount of the surfactant is from about 1 wt % to about 10 wt % of the total weight of the surfactant and the electrically conducting polymer.

In general, the anode and the conductive polymer layer will be patterned. It is understood that the pattern may vary as desired. The layers can be applied in a pattern by, for example, positioning a patterned mask or photoresist on the first flexible composite barrier structure prior to applying the first electrical contact layer material. Alternatively, the layers can be applied as an overall layer and subsequently patterned using, for example, a photoresist and wet chemical etching. As discussed above, the buffer layer can also be applied in a pattern by ink jet printing, lithography or thermal transfer patterning. Other processes for patterning that are well known in the art can also be used.

In a light-emitting diode, the active emission layer emits light when sufficient bias voltage is applied to the electrical contact layers, i.e., the anode and cathode. The light-emitting active emission layer may contain any organic electroluminescent or other organic light-emitting materials. Such materials can be small molecule materials such as those described in, for example, Tang, U.S. Pat. No. 4,356,429, Van Slyke et al., U.S. Pat. No. 4,539,507, the relevant portions of which are incorporated herein by reference. LEDs with an active emission layer comprised of small molecule (SMO) materials are common referred to as SMOLEDs. Alternatively, such materials can be polymeric materials such as those described in Friend et al. (U.S. Pat. No. 5,247,190), Heeger et al. (U.S. Pat. No. 5,408,109), Nakano et al. (U.S. Pat. No. 5,317,169), the relevant portions of which are incorporated herein by reference. LEDs with an active emission layer comprised of polymeric (P)

materials are common referred to as PLEDs. Preferred electroluminescent materials are semiconductive conjugated polymers. An example of such a polymer is poly(p-phenylenevinylene) referred to as PPV. The light-emitting materials may be dispersed in a matrix of another material, with and without additives, but preferably form a layer alone. The active organic layer generally has a thickness in the range of 50–500 nm. In order to prevent cross-talk between lines or pixels of the patterned anode, electrical conductivity of the buffer layers should be as low as possible without jeopardizing the light emission properties of the device. It has been found that when the buffer layer comprises an electrically conducting polymer and a surfactant that is a fluorosurfactant or a polyoxyethylene alkylphenol ether, the light-emitting diode shows a higher light emission efficiency, equivalent or lower turn-on voltage, and equivalent or higher brightness as compared to when the buffer layer comprises the electrically conducting polymer and no surfactant.

The active emission layer containing the active organic material can be applied from solutions by any conventional means, including spin-coating, casting, and printing. The active organic materials can be applied directly by vapor deposition processes, depending upon the nature of the materials. It is also possible to apply an active polymer precursor and then convert to the polymer, typically by heating.

The cathode is an electrode that is particularly efficient for injecting or collecting electrons or negative charge carriers. The cathode can be any metal or nonmetal having a lower work function than the first electrical contact layer (in this case, an anode). Materials for the second electrical contact layer can be selected from alkali metals of Group 1 (e.g., Li, Cs), the Group 2 (alkaline earth) metals, the Group 12 metals, the lanthanides, and the actinides. Materials such as aluminum, indium, calcium, barium, and magnesium, as well as combinations, can be used.

The cathode layer is usually applied by a physical vapor deposition process. In general, the cathode layer will be patterned, as discussed above in reference to the anode layer and the buffer layer. Similar processing techniques can be used to pattern the cathode layer.

The optional layer between the cathode and the active emission layer can function both to facilitate electron transport, and also serve as a confinement layer to prevent quenching reactions at layer interfaces. Preferably, this layer promotes electron mobility and reduces quenching reactions. Examples of electron transport materials for the optional layer include metal chelated oxinoid compounds, such as tris(8-hydroxyquinolato)aluminum ($Alq_3$); phenanthroline-based compounds, such as 2,9-dimethyl-4,7-diphenyl-1,10-phenanthroline (DDPA) or 4,7-diphenyl-1,10-phenanthroline (DPA), and azole compounds such as 2-(4-biphenylyl)-5-(4-t-butylphenyl)-1,3,4-oxadiazole (PBD) and 3-(4-biphenylyl)-4-phenyl-5-(4-t-butylphenyl)-1,2,4-triazole (TAZ).

It is known to have other layers in organic electronic devices. For example, there can be a layer between the buffer layer and the active emission layer to facilitate positive charge transport and/or band-gap matching of the layers, or to function as a protective layer. Similarly, there can be additional layers between the active emission layer and the cathode layer to facilitate negative charge transport and/or band-gap matching between the layers, or to function as a protective layer. Layers that are known in the art can be used. In addition, any of the above-described layers can be made of two or more layers. Alternatively, some or all of the anode layer, the buffer layer, the active emission layer, and the cathode layer, may be surface treated to increase charge carrier transport efficiency. The choice of materials for each of the component layers is preferably determined by balancing the goals of providing a device with high device efficiency.

The device can be prepared by sequentially depositing the individual layers on a suitable substrate. Substrates such as glass and polymeric films can be used. In most cases the anode is applied to the substrate and the layers are built up from there. However, it is possible to first apply the cathode to a substrate and add the layers in the reverse order. In general, the different layers will have the following range of thicknesses: anode, 50–500 nm, preferably 100–200 nm; buffer layer, 5–250 nm, preferably 20–200 nm; light-emitting active emission layer, 1–100 nm, preferably 10–80 nm; optional electron transport layer, 5–100 nm, preferably 20–80 nm; cathode, 20–1000 nm, preferably 30–500 nm.

EXAMPLES

The following examples illustrate certain features and advantages of the present invention. They are intended to be illustrative of the invention, but not limiting. All percentages are by weight, unless otherwise indicated.

All measurements of surface tension reported herein were made with a Digital Krüss Process Tensiometer K12 (Krüss GmbH, Hamburg, Germany). Measurements were carried out at room temperature. The vessel containing liquid to be measured has a diameter of 6.65 cm and a height of 10.0 cm. The measurement method is the Krüss 11 (P/SFT) with a minimum standard deviation of 0.02 mN/m.

Light emission measurement performed on flexible light-emitting diodes (LEDs), i.e., light-emitting diodes on flexible substrates, reported herein were carried out in the following manner. A flexible LED sample for the light emission measurement consisted of a flexible substrate, a layer of indium-tin-oxide to serve as the anode, a buffer layer, a layer of active emission material, and an array of aluminum dots 1.0 mm in diameter to serve as the cathode. The programmable voltage source of an HP 4155A semiconductor parameter analyzer (Hewlett-Packard, Palo Alto, Calif.) was connected to the anode and one aluminum dot with a mechanical device providing pressure contacts to the electrodes. Light emission was detected with a photodiode and thereby converted to a current for recording the light emission intensity. Device current and photodiode current were recorded continuously as the voltage applied to the electrodes was being stepped up automatically.

Light emission measurement performed on rigid light-emitting diodes (LEDs), i.e., light-emitting diodes on rigid, e.g., glass, substrates, reported herein were carried out in the following manner. A rigid LED sample for the light emission measurement was made as described for the flexible LEDs except that the substrate consisted of a rigid (glass) substrate. The current vs. the voltage, the light emission intensity (brightness) vs. the voltage, and efficiency (Cd/A) were measured with a Keithley 236 source-measure unit (Keithley Instrument Inc., Cleveland, Ohio), and a S370 optometer with a calibrated silicon photodiode (UDT Sensor, Inc. Hawthorne, Calif.).

Unless otherwise indicated, all measurements were carried out at room temperature, about 20°.

Comparative Experiment A

This Comparative Experiment demonstrates the results obtained when forming a buffer layer by spin-coating an aqueous polyaniline dispersion with no surfactant onto a flexible substrate containing an indium tin oxide (ITO) anode in an attempt to make a light-emitting diode.

The flexible substrate used in this Comparative Experiment is OC50/ST504 PET 7-mil (180 µm) poly(ethylene terephthalate) sheet, on one side of which has been deposited a thin layer of 50 ohm per square ITO, obtained from CPFilms Inc. (Canoga Park; CA). A 6 inch×1 inch (15.2 cm×2.5 cm) strip of the PET with the ITO layer was cut into 1 inch (2.5 cm) squares.

These squares were then cleaned and dried in the following manner. They were first cleaned with a dilute deionized water solution of Liqui-Nox® from Alonox, Inc. (New York, N.Y.) in a sonication bath for one hour. The squares were placed on a rack and were then rinsed with deionized water. They were placed into the sonication bath with fresh deionized water and resonicated for one hour. The squares were then removed from the rack and rinsed individually with deionized water first and then with isopropyl alcohol. The squares were then replaced into the rack and the rack placed into a vacuum oven at room temperature, about 20° C., overnight.

Spin-coating of an aqueous polyaniline dispersion was conducted as follows. A microscope slide was placed on a chuck equipped on a spin-coater from Headway Research Inc. (Garland, Tex.). A tiny drop of water was placed on the center of the slide to keep a square in place when placed on the slide. The surface of the square with the ITO layer was facing up and it was onto this ITO layer that the aqueous polyaniline dispersion was placed. The aqueous polyaniline dispersion was Ormecon® D1002W, which contains 2.6% w/w polyaniline in water, obtained from Ormecon Chemie Gmbh & Co, KG (Aammersbek, Germany). The dispersion was pipetted onto the square to cover the surface before spinning the chuck at 2,500 rpm for 60 seconds in an attempt to spin-coat the aniline onto the ITO layer on the square. When the spinning was stopped, there was no trace of polyaniline deposited on the square. This illustrates the difficulty of depositing polyaniline on the flexible substrate with the ITO coating when no surfactant is used.

Example 1

This Example demonstrates the results obtained with a light-emitting diode containing a buffer layer formed by spin-coating an aqueous polyaniline dispersion to which has been added polyoxyethylene (10) isooctylphenyl ether surfactant onto a flexible substrate containing an ITO anode.

A square of the flexible PET substrate with the ITO layer cleaned and dried in Comparative Experiment A was used for spin-coating the aqueous polyaniline dispersion Ormecon® D1002W, 2.6% w/w polyaniline in water, to which was added Triton® X-100, polyoxyethylene (10) isooctylphenyl ether, a non-ionic surfactant (product # 234729, Sigma-Aldrich Corp., St. Louis, Mo., USA). The concentration of Triton® X-100 was 0.35% w/w Triton® X-100 in Ormecon D1002W. Spin-coating of the aqueous dispersion containing the surfactant was carried out in essentially the same manner as described in Comparative Experiment A. The result was a smooth coating of the electrically conductive polyaniline and surfactant on the ITO layer. The coated-ITO-PET square was placed in a vacuum oven and the coating dried overnight at room temperature before being spin-coated with 1.50% w/w polyfluorene in p-xylene at 2,500 rpm for 60 seconds. The polyfluorene, a green emitting material, was GB001 (Cambridge Display Technology, Cambridge, UK) and serves as the active emission layer. The coated sample was placed in a vacuum oven at room temperature overnight before the vapor-deposition of the cathode, an array of aluminum dots having the dimensions of 1.0 mm in diameter and about 200 nm thick. This completed the fabrication of the light-emitting diode.

Light emission measurements were carried out on this flexible light-emitting diode as described above. The device had a turn-on voltage of 3.5 V and a photodiode current of 320 nA when the device voltage and current were 5.3 V and 1 mA respectively. The emission was already visibly bright under room light when the photodiode current was only 100 nA. This Example illustrates use of an aqueous dispersion of an electrically conducting polymer, polyaniline, to which has been added a surfactant, polyoxyethylene (10) isooctylphenyl ether to form a buffer layer and the performance of that buffer layer in a polymeric light-emitting diode on a flexible substrate. The comparison of this result with that of Comparative Experiment A shows the advantage of the presence of the surfactant.

Comparative Experiment B

This Comparative Experiment demonstrates the results obtained when forming a buffer layer by spin-coating an aqueous polyaniline dispersion with no surfactant onto a flexible substrate containing an ITO anode in an attempt to make a light-emitting diode.

The flexible substrate used in this Comparative Experiment is Alt-O-25-B-G-7 (180 µm) poly(ethylene terephthalate) PET sheet, on one side of which has been deposited a thin layer of 25 ohm per square ITO, obtained from Southwall Technologies, Inc. (Palo Alto, Calif.). 1 inch (2.5 cm) square pieces cut from the sheet were cleaned and dried in essentially the same manner as described in Comparative Experiment A. Spin-coating of the aqueous polyaniline dispersion Ormecon® D1002W, 2.6% w/w polyaniline in water, was carried out in essentially the same manner as described in Comparative Experiment A. The aqueous dispersion formed a high contact angle on the substrate and therefore resulted in only spotty coverage on the ITO surface. Spin-coating the surface with an electroluminescent polymer solution to form a cathode and complete the light-emitting diode was not carried out due to the spotty coating of the polyaniline.

Example 2

This Example demonstrates the results obtained with a light-emitting diode containing a buffer layer formed by spin-coating an aqueous polyaniline dispersion to which has been added polyoxyethylene (10) isooctylphenyl ether surfactant onto a flexible substrate containing an ITO anode.

A square of the flexible PET substrate with the ITO layer cleaned and dried in Comparative Experiment B was used for spin-coating the aqueous polyaniline dispersion Ormecon® D1002W, 2.6% w/w polyaniline in water, to which was added Triton® X-100, polyoxyethylene (10) isooctylphenyl ether. The concentration of Triton® X-100 was 0.40% w/w Triton® X-100 in Ormecon® D1002W. Spin-coating of the aqueous dispersion containing the surfactant was carried out in essentially the same manner as described in Comparative Experiment A. The result was a smooth coating of the electrically conductive polyaniline and surfactant on the ITO layer. The fabrication of light-emitting diode was completed following the procedure of Example 1. Light emission measurements were carried out on this light-emitting diode essentially as described in Example 1.

The device had a turn-on voltage of 4.0 V and a photodiode current of 241 nA when the device voltage and current were 6.6 V and 1 mA respectively. The emission was visibly bright under room light when the photodiode current was 100 nA. This Example illustrates use of an aqueous dispersion of an electrically conducting polymer, polyaniline, to which has been added a surfactant, polyoxyethylene (10) isooctylphenyl ether to form a buffer layer and the performance of that buffer layer in a polymeric light-emitting diode on a flexible substrate. The comparison of this result with that of Comparative Experiment B shows the advantage of the presence of the surfactant.

Examples 3–5 and Comparative Experiments C–D

Examples 3–5 demonstrate the results obtained with PLEDs containing buffer layers formed by spin-coating aqueous polyaniline dispersions to which have been added various amounts of polyoxyethylene (10) isooctylphenyl ether surfactant onto flexible substrates containing ITO anodes. Comparative Experiment C demonstrates the results obtained with a light-emitting diode containing no buffer layer. Comparative Experiment D demonstrates the results obtained with a light-emitting diode containing a buffer layer formed by spin-coating an aqueous polyaniline dispersion with no surfactant onto a flexible substrate containing an anode.

The flexible substrate used for these Examples and Comparative Experiments was NV1-062/ST504 5 mil (130 μm) poly(ethylene terephthalate) (PET) sheet on one side of which has been deposited a thin layer of 40 ohm per square ITO, obtained from NeoVac (Santa Rosa, Calif.). 1 inch squares of the sheet were cleaned and dried in essentially the same manner as described in Comparative Experiment A. The aqueous polyaniline dispersion used in these Examples and Comparative Experiment D is Ormecon® D1002W, 2.6% w/w polyaniline in water. The dispersion used to spin-coat the buffer layer of Comparative Experiment D contained no surfactant. The dispersions used to spin-coat the buffer layers of Examples 3, 4 and 5 had concentrations of surfactant of 0.05, 0.1 and 0.35% w/w Triton® X-100, polyoxyethylene (10) isooctylphenyl ether, in Ormecon® D1002W, respectively. Spin-coating of the aqueous dispersions containing the surfactant and that without the surfactant were carried out in essentially the same manner as described in Comparative Experiment A. The fabrication of the light-emitting diode was completed following the procedure of Example 1. The square for Comparative Experiment C contained no buffer layer so that the spin-coating of the polyfluorene layer was done directly onto the ITO layer The polyaniline dispersion without the surfactant did not wet the surface sufficiently in Comparative Example D to provide a complete, smooth coverage of the surface and therefore resulted in a spotty and inhomogeneous buffer layer. However, the active emission layer and the aluminum dot cathode were deposited in an attempt to fabricate a light-emitting diode.

Light emission measurements were carried out as described above and the results are shown in Table I.

TABLE I

| Example or Comp. Expt. | Buffer Layer Quality | Turn-on Voltage (V) | Photodiode Current (μA) @ 1 mA device current | Device Voltage (V) @ 1 mA device current |
|---|---|---|---|---|
| Comparative Experiment C | No buffer Layer | 5.5 | 0.62 | 10.5 |
| Comparative Experiment D | Inhomogeneous | 4.0 | 1.07, 0.72 | 5.8, 8.2 |
| Example 3 | Homogeneous | 4.0 | 0.90 | 5.6 |
| Example 4 | Homogeneous | 3.5 | 1.10 | 5.6 |
| Example 5 | Homogeneous | 4.0 | 0.66 | 5.5 |

The PLED without a buffer layer of Comparative Experiment C had a higher turn-on voltage and operating voltage then those of Comparative Experiment D and Examples 3–5, all of which have buffer layers. The data shown in Table I for Comparative Experiment D are the results for two of the dots of the cathode. One had a photodiode current of 1.07 μA when the device voltage and current were 5.8 V and 1 mA respectively. The other had a photodiode current of 0.72 μA when the device voltage and current were 8.2 V and 1 mA respectively. The variability is a result of the inhomogeneity of the buffer layer that results when no surfactant is used. The PLEDs of Examples 3–5 all had lower turn-on voltages, higher photodiode currents and lower operating voltages than the PLED of Comparative Experiment C and show consistency from one cathode dot to another in contrast to the PLED of Comparative Experiment D. The photodiode current increased as the amount of surfactant increased from 0.05% w/w surfactant in the aqueous dispersion in Example 3 to 0.1% w/w surfactant in the aqueous dispersion in Example 4 and then decreased as the amount of surfactant was increased to 0.35% w/w surfactant in the aqueous dispersion in Example 5. To get the greatest improvement in buffer layer performance when polyoxyethylene (10) isooctylphenyl ether surfactant is added to the aqueous polyaniline dispersion of these Examples, the amount of surfactant used should be at least 0.05% w/w surfactant in the aqueous dispersion and preferably less than 0.30% w/w surfactant in the aqueous dispersion.

Examples 6–8 and Comparative Experiments E–G

These Examples and Comparative Experiments illustrate the amount of polyoxyethylene (10) isooctylphenyl ether surfactant that must be added to an aqueous polyaniline dispersion to provide the surface tension required for coatability of a buffer layer on a flexible substrate that will result in improved performance.

The aqueous polyaniline dispersion used in these Examples and Comparative Experiments is Ormecon® D1002W, 2.6% w/w polyaniline in water. The dispersions of Comparative Experiment E, Examples 6–8 and Comparative Experiments F and G had concentrations of surfactant of 0. 0.05, 0.10, 0.16, 0.5 and 1.0% w/w Triton® X-100, polyoxyethylene (10) isooctylphenyl ether, in Ormecon® D1002W, respectively.

The surface tension was measured as described above. The surface tensions of dispersions of Comparative Experiment E, Examples 6–8 and Comparative Experiments F and G were 41.9, 34.1, 33.7 and 33.3, 31.9 and 31.8 mN/m, respectively. There was little change in surface tension for surfactant concentrations above that of Example 8, i.e., above 0.16 w/w surfactant in the aqueous dispersion. The amount of this surfactant that should be used with this aqueous dispersion is at least about 0.05% w/w surfactant in the aqueous dispersion and less than about 0.40% w/w surfactant in the aqueous dispersion, preferably less than about 0.30% w/w surfactant in the aqueous dispersion. Higher concentrations of surfactant would adversely impact device performance as illustrated in Example 3–5 and Comparative Experiments C–D.

Examples 9–11 and Comparative Experiment H

These Examples and Comparative Experiment illustrate the amount of polyoxyethylene (10) isooctylphenyl ether surfactant that must be added to an aqueous poly(3,4-ethylenedioxythiophene)/poly(styrenesulfonate) (PEDOT/PSS) dispersion to provide the surface tension required for coatability of a buffer layer on a flexible substrate that will result in improved performance.

The aqueous PEDOT/PSS dispersion used in these Examples and Comparative Experiment is Baytron®-P (VP Al4083) obtained from Bayer AG (Germany). The Baytron®-P contains 1.5 to 2.0% w/w poly(3,4-ethylenedioxythiophene)/poly(styrenesulfonate) (PEDOT/PSS) in water. The dispersions of Comparative Experiment H and Examples 9–11 had concentrations of surfactant of 0. 0.05, 0.10 and 0.15% w/w Triton® X-100, polyoxyethylene (10) isooctylphenyl ether, in the aqueous PEDOT/PSS dispersion, respectively.

The surface tension was measured as described above. The surface tensions of dispersions of Comparative Experiment H and Examples 9–11 were 42.6, 29.7, 30.4 and 30.8 mN/m, respectively. There was little change in surface tension for surfactant concentrations above that of Example 9, i.e., above 0.05% w/w surfactant in the aqueous dispersion. The amount of this surfactant that should be used with this aqueous dispersion is at least about 0.05% w/w surfactant in the aqueous dispersion and less than about 0.40% w/w surfactant in the aqueous dispersion, preferably less than about 0.30% w/w surfactant in the aqueous dispersion.

Examples 12–16 and Comparative Experiments I, J

Examples 12–16 and Comparative Experiments I and J demonstrate the results obtained with PLEDs containing buffer layers formed by spin-coating aqueous polyaniline/poly(2-acrylamido-2-methyl-1-propanesulfonic acid) (PAni/PAAMPSA) dispersions to which have been added certain surfactants onto glass substrates containing ITO anodes.

The glass substrates were 3 cm×3 cm with a 1.5 cm×2.0 cm layer of ITO having a thickness of 100 to 150 nm. These substrates with the ITO layers were cleaned and dried in essentially the same manner as described in Comparative Experiment A and subsequently treated with oxygen plasma to purposely remove the factor of wetability for comparison of light emission properties with the various surfactants.

The aqueous dispersion used to spin-coat a buffer layer was 1.0% w/w electrically conductive polyaniline/poly(2-acrylamido-2-methyl-1-propanesulfonic acid), PAni/P(AAMPSA), in water obtained from Uniax Corp. (Santa Barbara, Calif.).

No surfactant was added to the aqueous dispersion used to spin-coat the buffer layer of Comparative Experiment I. The surfactant added to the aqueous dispersion used to spin-coat the buffer layer of Comparative Experiment J was lithium dodecylsulfate, an ionic surfactant (Cat# 86,190-1, Sigma-Aldrich Corp., St. Louis, Mo., USA). The concentration of lithium dodecylsulfate was 0.15% w/w lithium dodecylsulfate in the aqueous PAni/P(AAMPSA) dispersion. The surfactant added to the aqueous dispersion used to spin-coat the buffer layer of Example 12 was Triton® X-100, polyoxyethylene (10) isooctylphenyl ether. The concentration of Triton® X-100 was 0.15% w/w Triton® X-100 in the aqueous PAni/P(AAMPSA) dispersion. The surfactant added to the aqueous dispersion used to spin-coat the buffer layer of Example 13 was Zonyl® FS-300, a non-ionic fluorosurfactant containing a perfluoroalkylpolyoxyethylene with the formula $R_fCH_2CH_2O(CH_2CH_2O)_zH$ wherein $R_f$ is a perfluoroalkyl group with the formula $F(CF_2CF_2)_{3-8}$ (DuPont Co., Wilmington, Del.). The concentration of Zonyl® FS-300 was 0.15% w/w Zonyl® FS-300 in the aqueous PAni/P(AAMPSA) dispersion. The surfactant added to the aqueous dispersion used to spin-coat the buffer layer of Example 14 was Zonyl® FSN-100, a non-ionic fluorosurfactant containing a perfluoroalkylpolyoxyethylene with the formula $R_fCH_2CH_2O(CH_2CH_2O)_xH$ wherein $R_f$ is a perfluoroalkyl group with the formula $F(CF_2CF_2)_{3-8}$ (DuPont Co., Wilmington, Del.). The concentration of Zonyl® FSN-100 was 0.15% w/w Zonyl® FSN-100 in the aqueous PAni/P (AAMPSA) dispersion. The surfactant added to the aqueous dispersion used to spin-coat the buffer layer of Example 15 was 3M® Fluorad® Fluorosurfactant FC430, a non-ionic fluorosurfactant containing a fluoroaliphatic polymeric ester (3M, St. Paul, Minn.). The concentration of FC430 was 0.05% w/w FC430 in the aqueous PAni/P(AAMPSA) dispersion. The surfactant added to the aqueous dispersion used to spin-coat the buffer layer of Example 16 was Zonyl® FSA, an ionic fluorosurfactant containing a lithium carbonate of a perfluoroalkylethylenesulfurethylene with the formula $R_fCH_2CH_2SCH_2CH_2CO_2Li$ wherein $R_f$ is a perfluoroalkyl group with the formula $F(CF_2CF_2)_{3-8}$ (E. I. du Pont de Nemours and Company, Wilmington, Del.). The concentration of Zonyl® FSA was 0.10% w/w Zonyl® FSA in the aqueous PAni/P(AAMPSA) dispersion.

Each aqueous dispersion with or without a surfactant was spin-coated onto the ITO containing glass substrates at a spinning speed of 1200 rpm. The buffer layer thicknesses were in the range of 50 nm; the thickness of each is shown in Table II. The ITO containing glass substrates with the buffer layers were dried in nitrogen at 90° C. for 30 minutes.

The buffer layers were each then spin-coated with an active emission layer comprised of a yellow emitter PDY® 131, a poly(substituted-phenylene vinylene) (Covion Company, Frankfurt, Germany) in essentially the same manner as described for spin-coating the active emission layer of Example 1. The thickness of the active emission layer was approximately 70 nm. All film thickness was measured with a TENCOR 500 Surface Profiler (TENCOR, Inc., Mountain View, Calif.).

To serve as the cathode for each of the PLEDs, first a layer of barium and then a layer of aluminum were vapor deposited on top of the active emission layer under a vacuum of $1\times10^{-6}$ torr. The thickness of the barium layer was 3 nm; the thickness of the aluminum layer was 300 nm.

Device performance was tested as described above, with the results shown in Table II.

TABLE II

| Example or Comp. Expt. | Buffer Layer Thickness (nm) | Voltage (V) @ 200 Cd/m² Brightness | Efficiency (Cd/A) @ 200 Cd/m² Brightness | Brightness (Cd/m²) @ 3.3 mA/cm², 80° C. |
|---|---|---|---|---|
| Comparative Experiment I | 59.8 | 3.3 | 6.7 | 204 |
| Comparative Experiment J | 44.0 | electrical short | — | — |

TABLE II-continued

| Example or Comp. Expt. | Buffer Layer Thickness (nm) | Voltage (V) @ 200 Cd/m² Brightness | Efficiency (Cd/A) @ 200 Cd/m² Brightness | Brightness (Cd/m²) @ 3.3 mA/cm², 80° C. |
|---|---|---|---|---|
| Example 12 | 48.7 | 3.2 | 7.6 | 234 |
| Example 13 | 44.6 | 3.2 | 7.6 | 240 |
| Example 14 | 57.4 | 3.2 | 8.0 | 200 |
| Example 15 | 52.4 | 3.5 | 7.5 | — |
| Example 16 | 47.8 | 3.2 | 7.2 | — |

The lithium dodecylsulfate surfactant used in the buffer layer of Comparative Experiment J resulted in an electrical short in the PLED which indicates that alkylsulfate surfactants should not be used in making the buffer layer.

The PLED of Example 12, with a buffer layer made with polyoxyethylene (10) isooctylphenyl ether surfactant added to the aqueous PAni/P(AAMPSA) dispersion, showed a higher light emission efficiency at 200 Cd/m², a comparable turn-on voltage at 200 Cd/M², and higher light emission brightness at 3.3 mA/cm² and 80° C. as compared with the PLED of Comparative Experiment I, with a buffer layer made without a surfactant being added to the aqueous PAni/P(AAMPSA) dispersion.

The PLEDs of Examples 13–16, with buffer layers made with a fluorosurfactant added to the aqueous PAni/P(AAMPSA) dispersion, showed a higher light emission efficiency at 200 Cd/m², a slightly lower or comparable turn-on voltage at 200 Cd/m², and equivalent or higher light emission brightness at 3.3 mA/cm² and 80° C. as compared with the PLED of Comparative Experiment I, with a buffer layer made without a surfactant being added to the aqueous PAni/P(AAMPSA) dispersion.

These Examples and Comparative Experiments demonstrate the improvement in PLED performance obtained with PLEDs containing buffer layers formed by spin-coating aqueous polyaniline/poly(2-acrylamido-2-methyl-1-propanesulfonic acid) dispersions to which have been added a polyoxyethylene (10) isooctylphenyl ether surfactant, a fluorosurfactant containing a fluoroaliphatic polymeric ester or a fluorosurfactant containing a perfluoroalkyl group with the formula $F(CF_2CF_2)_{3-8}$.

Examples 17–20 and Comparative Experiments K, L

Examples 17–20 and Comparative Experiments K and L demonstrate the results obtained with PLEDs containing buffer layers formed by spin-coating aqueous poly(3,4-ethylenedioxythiophene)/poly(styrenesulfonate) (PEDOT/PSS) dispersions to which have been added various surfactants onto glass substrates containing ITO anodes.

The aqueous (PEDOT/PSS) dispersion used to spin-coat a buffer layer was Baytron-P® which contains 1.5 to 2.0% w/w poly(3,4-ethylenedioxythiophene)/poly(styrenesulfonate) (PEDOT/PSS) in water and was obtained from Bayer AG (Germany).

No surfactant was added to the aqueous dispersion used to spin-coat the buffer layer of Comparative Experiment K. The surfactant added to the aqueous dispersion used to spin-coat the buffer layer of Comparative Experiment L was lithium dodecylsulfate. The concentration of lithium dodecylsulfate was 0.15% w/w lithium dodecylsulfate in the aqueous PEDOT/PSS dispersion. The surfactant added to the aqueous dispersion used to spin-coat the buffer layer of Example 17 was Triton® X-100 with a concentration of 0.15% w/w Triton® X-100 in the aqueous PEDOT/PSS dispersion. The surfactant added to the aqueous dispersion used to spin-coat the buffer layer of Example 18 was Zonyl® FS-300 with a concentration of 0.15% w/w Zonyl® FS-300 in the aqueous PEDOT/PSS dispersion. The surfactant added to the aqueous dispersion used to spin-coat the buffer layer of Example 19 was 3M® Fluorad® Fluorosurfactant FC-430 with a concentration of 0.05% w/w FC-430 in the aqueous PEDOT/PSS dispersion. The surfactant added to the aqueous dispersion used to spin-coat the buffer layer of Example 20 was Zonyl® FSA with a concentration of 0.10% w/w Zonyl® FSA in the aqueous PEDOT/PSS dispersion.

Light-emitting diodes were fabricated using the same substrate material and procedures as described in Examples 12–16. The devices were tested as described for Examples 12–16, with the results shown in Table III below.

TABLE III

| Example or Comp. Expt. | Buffer Layer Thickness (nm) | Voltage (V) @ 200 Cd/m² Brightness | Efficiency (Cd/A) @ 200 Cd/m² Brightness | Brightness (Cd/m²) @ 3.3 mA/cm², 80° C. |
|---|---|---|---|---|
| Comparative Experiment K | 135 | 3.3 | 7.0 | 202 |
| Comparative Experiment L | 137 | 3.2 | 5.7 | 140 |
| Example 17 | 154 | 3.4 | 7.3 | 270 |
| Example 18 | 120 | 3.3 | 7.5 | 217 |
| Example 19 | 120 | 3.2 | 7.7 | 212 |
| Example 20 | 120 | 3.4 | 7.6 | 194 |

The PLED of Comparative Experiment L, with a buffer layer made with lithium dodecylsulfate surfactant added to the aqueous PEDOT/PSS dispersion, showed a lower light emission efficiency at 200 Cd/m², a comparable turn-on voltage at 200 Cd/m², and lower light emission brightness at 3.3 mA/cm² and 80° C. as compared with the PLED of Comparative Experiment K, with a buffer layer made without a surfactant being added to the aqueous PEDOT/PSS dispersion. This demonstrates again that alkylsulfate surfactants should not be used in making the buffer layer.

The PLED of Example 17, with a buffer layer made with polyoxyethylene (10) isooctylphenyl ether surfactant added to the aqueous PEDOT/PSS dispersion, showed a higher light emission efficiency at 200 Cd/m², a comparable turn-on voltage at 200 Cd/m², and higher light emission brightness at 3.3 mA/cm² and 80° C. as compared with the PLED of Comparative Experiment J, with a buffer layer made without a surfactant being added to the aqueous PEDOT/PSS dispersion.

The PLEDs of Examples 18 and 20, with buffer layers made with fluorosurfactants containing a perfluoroalkyl group with the formula $F(CF_2CF_2)_{3-8}$ added to the aqueous PEDOT/PSS dispersion, showed a higher light emission efficiency at 200 Cd/m², a comparable turn-on voltage at 200 Cd/m², and higher or comparable light emission brightness at 3.3 mA/cm² and 80° C. as compared with the PLED of Comparative Experiment K, with a buffer layer made without a surfactant being added to the aqueous PEDOT/PSS dispersion. The PLED of Example 19, with a buffer layer made with the fluorosurfactant containing a fluoroaliphatic polymeric ester added to the aqueous PEDOT/PSS dispersion, showed a higher light emission efficiency at 200 Cd/m², a comparable turn-on voltage at 200 Cd/m², and higher light emission brightness at 3.3 mA/cm² and 80° C.

as compared with the PLED of Comparative Experiment J, with a buffer layer made without a surfactant being added to the aqueous PEDOT/PSS dispersion.

These Examples and Comparative Experiments demonstrate the improvement in PLED performance obtained with PLEDs containing buffer layers formed by spin-coating aqueous poly(3,4-ethylenedioxythiophene)/poly(styrenesulfonate) dispersions to which have been added a polyoxyethylene (10) isooctylphenyl ether surfactant, a fluorosurfactant containing a fluoroaliphatic polymeric ester or a fluorosurfactant containing a perfluoroalkyl group with the formula $F(CF_2CF_2)_{3-8}$.

Comparative Experiment M

This Comparative Experiment demonstrates the results obtained in an attempt to make a light-emitting diode with a bilayer anode comprised of a metal layer and a dielectric layer on a flexible substrate and without the buffer layer of the invention.

The flexible substrate used in this Comparative Experiment is a transparent conductive film Altair®-M 10 (South-Well Company, Palo Alto, Calif.) 7-mil (180 µm) poly(ethylene terephthalate) (PET) sheet. On one side of this sheet there has been deposited first a dielectric layer. A metal layer, shown by energy dispersive X-ray spectroscopy to be a gold/silver alloy, has been deposited onto the dielectric. An indium oxide dielectric layer has been deposited onto the metal layer. It has a sheet resistance of 10 ohms per square.

A 12 inch×1 inch (30.5 cm×2.5 cm) strip of the PET with the bilayer anode was cut into 1 inch (2.5 cm) squares. These squares were cleaned and dried in essentially the same manner as described in Comparative Experiment A.

Devices were fabricated following the procedure of Example 1, with the surface of the substrate with the dielectric/metal/dielectric facing up, and spinning 8 drops of polyfluorene for 90 seconds.

Light emission measurements were carried out on this light-emitting diode essentially as described in Example 1. As indicated in Table IV, the device had a turn-on voltage greater than 15 V. As the voltage was increased above 15 V, the aluminum dot cathode burned before there was any evidence of light emission. This Comparative Experiment shows that the flexible substrate with the bilayer anode and no buffer layer does not result in a light-emitting diode.

Comparative Experiment N

This Comparative Experiment demonstrates the results obtained in an attempt to make a light-emitting diode with a bilayer anode comprised of a metal layer and a dielectric layer on a flexible substrate and with a buffer layer formed by spin-coating an aqueous polyaniline dispersion with no surfactant onto the bilayer anode. A square of the flexible PET substrate with the bilayer anode cleaned and dried in Comparative Experiment M was not wettable by an aqueous polyaniline dispersion Ormecon® D1002W, 2.6% w/w polyaniline in water, and a buffer layer could not be formed by spin coating, in essentially the same manner as described in Comparative Example A, the polyaniline dispersion with no surfactant present in the dispersion.

Example 21

This Example demonstrates the results obtained with a light-emitting diode with a bilayer anode comprised of a metal layer and a dielectric layer on a flexible substrate and a buffer layer formed by spin-coating on to the anode an aqueous polyaniline dispersion to which has been added polyoxyethylene (10) isooctylphenyl ether surfactant.

Light-emitting diodes were fabricated following the procedure of Comparative Experiment M. Light emission measurements were carried out on this light-emitting diode essentially as described in Example 1, with the results shown in Table IV The comparison of this result with that of Comparative Experiments M and N shows that the buffer layer of the invention makes possible the use of a bilayer anode on this flexible substrate in a light-emitting diode.

Comparative Experiment O

This Comparative Experiment demonstrates the with a light-emitting diode with a bilayer anode comprised of a metal layer and a dielectric layer on a flexible substrate and without the buffer layer of the invention.

The flexible substrate used in this Comparative Experiment is a transparent conductive film AgHT4 PET (CPFilms Inc., Canoga Park, Calif.), a 7-mil (180 µm) poly(ethylene terephthalate) (PET) sheet. On one side of this sheet there has been deposited first a thin layer of silver. A dielectric layer has been deposited onto the silver layer. It has a sheet resistance of 4 ohms per square.

A 6 inch×1 inch (15.2 cm×2.5 cm) strip of the PET with the bilayer anode was cut into 1 inch (2.5 cm) squares. These squares were cleaned and dried in essentially the same manner as described in Comparative Experiment A.

A light-emitting diode was fabricating following the procedure of Comparative Experiment M.

Light emission measurements were carried out on this light-emitting diode essentially as described in Example 1, with the results shown in Table IV. This Comparative Experiment shows that the flexible substrate with the bilayer anode results in a poor performing light-emitting diode without the buffer layer of the invention.

Comparative Experiment P

This Comparative Experiment demonstrates the results obtained in an attempt to make a light-emitting diode with a bilayer anode comprised of a metal layer and a dielectric layer on a flexible substrate and with a buffer layer formed by spin-coating an aqueous polyaniline dispersion with no surfactant onto the bilayer anode.

A square of the flexible PET substrate with the bilayer anode cleaned and dried in Comparative Experiment O was not wettable by an aqueous polyaniline dispersion Ormecon® D1002W, 2.6% w/w polyaniline in water, and a buffer layer could not be formed by spin coating, in essentially the same manner as described in Comparative Example A, the polyaniline dispersion with no surfactant present in the dispersion.

Example 22

This Example demonstrates the results obtained with a light-emitting diode with a bilayer anode comprised of a metal layer and a dielectric layer on a flexible substrate and a buffer layer formed by spin-coating on to the anode an aqueous polyaniline dispersion to which has been added polyoxyethylene (10) isooctylphenyl ether surfactant.

A square of the flexible PET substrate with the bilayer anode cleaned and dried in Comparative Experiment O was used to prepare a light-emitting diode essentially as described in Example 21 except that the concentration of Triton® X-100 was less than 0.3% w/w Triton® X-100 in Ormecon® D1002W.

Light emission measurements were carried out on this light-emitting diode essentially as described in Example 1, with the results shown in Table IV. The comparison of this result with that of Comparative Experiments O and P shows that the buffer layer of the invention makes possible the use of a bilayer anode on this flexible substrate in a light-emitting diode.

TABLE IV

| Example or Comp. Expt. | Turn-on Voltage (V) | Photodiode Current (nA) @ 1 mA device current | Device Voltage (V) @ 1 mA device current |
|---|---|---|---|
| Comparative Experiment M | >15 | 0 | — |
| Example 21 | 4.0 | 203 | 6.3 |
| Comparative Experiment O | 14 | 60 | 24 |
| Example 22 | 4.0 | 300 | 6.7 |

What is claimed is:

1. A light-emitting device on a substrate, said light-emitting device comprising:
   (a) an anode;
   (b) a cathode;
   (c) an active emission layer positioned between said anode and said cathode; and
   (d) a buffer layer positioned between said anode and said active emission layer, wherein said buffer layer is comprised of an electrically conducting polymer and a surfactant, the amount of said surfactant is from about 0.5 wt % to about 15 wt % of the total weight of said surfactant and said electrically conducting polymer, and said surfactant is a fluorosurfactant or a polyoxyethylene alkylphenol ether.

2. The device of claim 1, wherein said surfactant is a non-ionic surfactant.

3. The device of claim 2, wherein said non-ionic surfactant is a fluorosurfactant.

4. The device of claim 3, wherein said fluorosurfactant contains a perfluoroalkyl group with the formula $F(CF_2CF_2)_{3-8}$.

5. The device of claim 4, wherein said fluorosurfactant is a perfluoroalkylpolyoxyethylene.

6. The device of claim 3, wherein said fluorosurfactant is comprised of a fluoroaliphatic polymeric ester.

7. The device of claim 2, wherein said non-ionic surfactant is a polyoxyethlyene alkylphenol ether.

8. The device of claim 7, wherein said polyoxyethlyene alkylphenol ether is polyoxyethylene (10) isooctylphenyl ether.

9. The device of claim 1 wherein said fluorosurfactant is an ionic fluorosurfactant.

10. The device of claim 1, wherein the amount of said surfactant is from about 1 wt % to about 10 wt % of the total weight of said surfactant and said electrically conducting polymer.

11. The device of claim 1, wherein said electrically conducting polymer is a polyaniline.

12. The device of claim 1, wherein said electrically conducting polymer is a poly(dioxythiopene).

13. The device of claim 12, wherein said poly(dioxythiopene) is poly(3,4-ethylenedioxythiophene).

14. The device of claim 1, wherein said anode is comprised of at least one bilayer comprised of a metal layer and a dielectric layer and wherein at least one of said dielectric layer is adjacent to said buffer layer.

15. The device of claim 14, wherein at least one of said dielectric layer disposed adjacent to said buffer layer is disposed directly on said buffer layer.

16. A light-emitting device on a substrate, said light-emitting device comprising:
   (a) an anode;
   (b) a cathode;
   (c) an active emission layer positioned between said anode and said cathode; and
   (d) a buffer layer positioned between said anode and said active emission layer, wherein said buffer layer is formed using an aqueous dispersion of an electrically conducting polymer to which has been added a surfactant, said dispersion is characterized by a surface tension of between 25 and 35 mN/M, the concentration of said electrically conducting polymer is from 0.1 to 5.0% w/w of said electrically conducting polymer in said dispersion, the concentration of said surfactant is less than about 0.4% w/w of said surfactant in said dispersion, and said surfactant is a fluorosurfactant or a polyoxyethylene alkylphenol ether.

17. The device of claim 16, wherein said surfactant is a non-ionic surfactant.

18. The device of claim 17, wherein said non-ionic surfactant is a fluorosurfactant.

19. The device of claim 18, wherein said fluorosurfactant contains a perfluoroalkyl group with the formula $F(CF_2CF_2)_{3-8}$.

20. The device of claim 19, wherein said fluorosurfactant is a perfluoroalkylpolyoxyethylene.

21. The device of claim 18, wherein said fluorosurfactant is comprised of a fluoroaliphatic polymeric ester.

22. The device of claim 17, wherein said non-ionic surfactant is a polyoxyethlyene alkylphenol ether.

23. The device of claim 22, wherein said polyoxyethlyene alkylphenol ether is polyoxyethylene (10) isooctylphenyl ether.

24. The device of claim 16, wherein said concentration of said electrically conducting polymer is from 0.1 to 5.0% w/w of said electrically conducting polymer in said dispersion and said concentration of said surfactant is less than about 0.3% w/w of said surfactant in said dispersion.

25. The device of claim 16, wherein said electrically conducting polymer is a polyaniline.

26. The device of claim 16, wherein said electrically conducting polymer is a poly(dioxythiopene).

27. The device of claim 26, wherein said poly(dioxythiopene) is poly(3,4-ethylenedioxythiophene).

28. The device of claim 16, wherein said anode is comprised of indium tin oxide.

29. The device of claim 16, wherein said anode is comprised of at least one bilayer, each of the at least one bilayer comprising a metal layer and a dielectric layer, wherein at least one of said dielectric layer is adjacent to said buffer layer.

30. The device of claim 29, wherein at least one of said dielectric layer disposed adjacent to said buffer layer is disposed directly on said buffer layer.

* * * * *